(12) United States Patent
Strachan et al.

(10) Patent No.: US 9,905,428 B2
(45) Date of Patent: Feb. 27, 2018

(54) SPLIT-GATE LATERAL EXTENDED DRAIN MOS TRANSISTOR STRUCTURE AND PROCESS

(71) Applicant: Texas Instruments Incorporated, Dallas, TX (US)

(72) Inventors: Andrew D Strachan, Santa Clara, CA (US); Alexei Sadovnikov, Sunnyvale, CA (US); Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/930,633

(22) Filed: Nov. 2, 2015

(65) Prior Publication Data

US 2017/0125252 A1    May 4, 2017

(51) Int. Cl.
*H01L 29/78* (2006.01)
*H01L 21/336* (2006.01)
(Continued)

(52) U.S. Cl.
CPC .. *H01L 21/28114* (2013.01); *H01L 21/28158* (2013.01); *H01L 29/0634* (2013.01); *H01L 29/0649* (2013.01); *H01L 29/0696* (2013.01); *H01L 29/0865* (2013.01); *H01L 29/0882* (2013.01); *H01L 29/1083* (2013.01); *H01L 29/1095* (2013.01); *H01L 29/402* (2013.01); *H01L 29/42356* (2013.01); *H01L 29/66659* (2013.01); *H01L 29/66681* (2013.01); *H01L 29/7816* (2013.01); *H01L 29/7831* (2013.01);
(Continued)

(58) Field of Classification Search
CPC ........ H01L 29/7831–29/7836; H01L 29/0852; H01L 29/0847; H01L 29/402; H01L 29/66659; H01L 29/7816; H01L 29/1045; H01L 29/66681; H01L 29/1083; H01L 29/0634; H01L 29/0696
See application file for complete search history.

(56) References Cited

U.S. PATENT DOCUMENTS

| 5,608,243 | A | 3/1997 | Chi et al. |
|---|---|---|---|
| 6,118,157 | A | 9/2000 | Bergemont |

(Continued)

FOREIGN PATENT DOCUMENTS

| EP | 1548823 A1 | 6/2005 |
|---|---|---|
| WO | 2014093488 A1 | 6/2014 |

*Primary Examiner* — Marvin Payen
*Assistant Examiner* — Jeremy Joy
(74) *Attorney, Agent, or Firm* — Jacqueline J. Garner; Charles A. Brill; Frank D. Cimino

(57) ABSTRACT

A semiconductor device includes a split-gate lateral extended drain MOS transistor, which includes a first gate and a second gate laterally adjacent to the first gate. The first gate is laterally separated from the second gate by a gap of 10 nanometers to 250 nanometers. The first gate extends at least partially over the body, and the second gate extends at least partially over a drain drift region. The drain drift region abuts the body at a top surface of the substrate. A boundary between the drain drift region and the body at the top surface of the substrate is located under at least one of the first gate, the second gate and the gap between the first gate and the second gate. The second gate may be coupled to a gate bias voltage node or a gate signal node.

18 Claims, 8 Drawing Sheets

(51) Int. Cl.
   *H01L 29/66*    (2006.01)
   *H01L 21/28*    (2006.01)
   *H01L 29/06*    (2006.01)
   *H01L 29/10*    (2006.01)
   *H01L 29/08*    (2006.01)
   *H01L 29/423*   (2006.01)
   *H01L 29/40*    (2006.01)

(52) U.S. Cl.
   CPC ...... *H01L 29/7835* (2013.01); *H01L 29/0653* (2013.01); *H01L 29/42368* (2013.01); *H01L 29/42376* (2013.01); *H01L 29/665* (2013.01)

(56) References Cited

U.S. PATENT DOCUMENTS

| | | |
|---|---|---|
| 6,259,142 B1 | 7/2001 | Dawson et al. |
| 6,825,531 B1* | 11/2004 | Mallikarjunaswamy ............ H01L 29/66681 257/343 |
| 2004/0166698 A1* | 8/2004 | Kim ................ H01L 21/82346 438/200 |
| 2005/0045939 A1 | 3/2005 | Park |
| 2005/0136676 A1* | 6/2005 | Liu ..................... H01L 27/115 438/703 |
| 2006/0113601 A1* | 6/2006 | Shibib ................ H01L 29/402 257/365 |
| 2006/0151827 A1* | 7/2006 | Kumazaki ............... H01L 21/84 257/318 |
| 2008/0061354 A1* | 3/2008 | Chih .................... H01L 27/105 257/316 |
| 2009/0101990 A1* | 4/2009 | Kang ................ H01L 29/66681 257/379 |
| 2009/0273013 A1* | 11/2009 | Winstead .......... H01L 27/11526 257/315 |
| 2011/0169078 A1* | 7/2011 | Yang ................... H01L 27/0705 257/336 |
| 2011/0260247 A1* | 10/2011 | Yang ................... H01L 29/0653 257/343 |
| 2013/0134512 A1* | 5/2013 | Cheng ................... H01L 29/402 257/339 |
| 2013/0292763 A1* | 11/2013 | Chang ................ H01L 29/7816 257/335 |
| 2015/0115361 A1* | 4/2015 | Su ....................... H01L 29/7816 257/336 |
| 2016/0141413 A1* | 5/2016 | Noh ................... H01L 29/1095 257/337 |
| 2016/0240658 A1* | 8/2016 | Kim ..................... H01L 29/402 |

* cited by examiner

SPLIT-GATE LATERAL EXTENDED DRAIN MOS TRANSISTOR STRUCTURE AND PROCESS

FIELD OF THE INVENTION

This invention relates to the field of semiconductor devices. More particularly, this invention relates to MOS transistors in semiconductor devices.

BACKGROUND OF THE INVENTION

It is desirable to operate lateral drain extended metal oxide semiconductor (MOS) transistors at increasingly higher frequencies. For example, higher operation frequencies in voltage regulators enables smaller inductors, providing reduced system costs. Operating frequency is limited by the gate-drain capacitance. It is also desirable to provide lower resistances of the lateral drain extended MOS transistors to improve power efficiency in the voltage regulators. Simultaneously attaining desired operating frequencies and resistances in lateral drain extended MOS transistors has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a split-gate lateral extended drain MOS transistor, referred to herein as the split-gate transistor, which includes a first gate which extends at least partially over a body of the split-gate transistor, and a second gate which extends at least partially over a drain drift region of the split-gate transistor. The first gate is laterally separated from the second gate by a gap of 10 nanometers to 250 nanometers. A boundary between the drain drift region and the body at a top surface of the substrate is located under at least one of the first gate, the second gate and the gap between the first gate and the second gate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes a split-gate lateral extended drain MOS transistor, referred to herein as the split-gate transistor, which includes a first gate over a top surface of a substrate of the semiconductor device, and a second gate over the top surface of the substrate, laterally adjacent to the first gate. The first gate extends at least partially over a body of the split-gate transistor, and the second gate extends at least partially over a drain drift region of the split-gate transistor. The first gate is laterally separated from the second gate by a gap of 10 nanometers to 250 nanometers. The gap must be at least 10 nanometers to maintain a desired electrical isolation between the first gate and the second gate. The gap cannot be more than 250 nanometers to maintain a desired conductivity in an inversion layer under the first gate and the second gate during operation of the split-gate transistor. The drain drift region abuts the body at a top surface of the substrate. A boundary between the drain drift region and the body at the top surface of the substrate is located under at least one of the first gate, the second gate and the gap between the first gate and the second gate.

Figure 1:
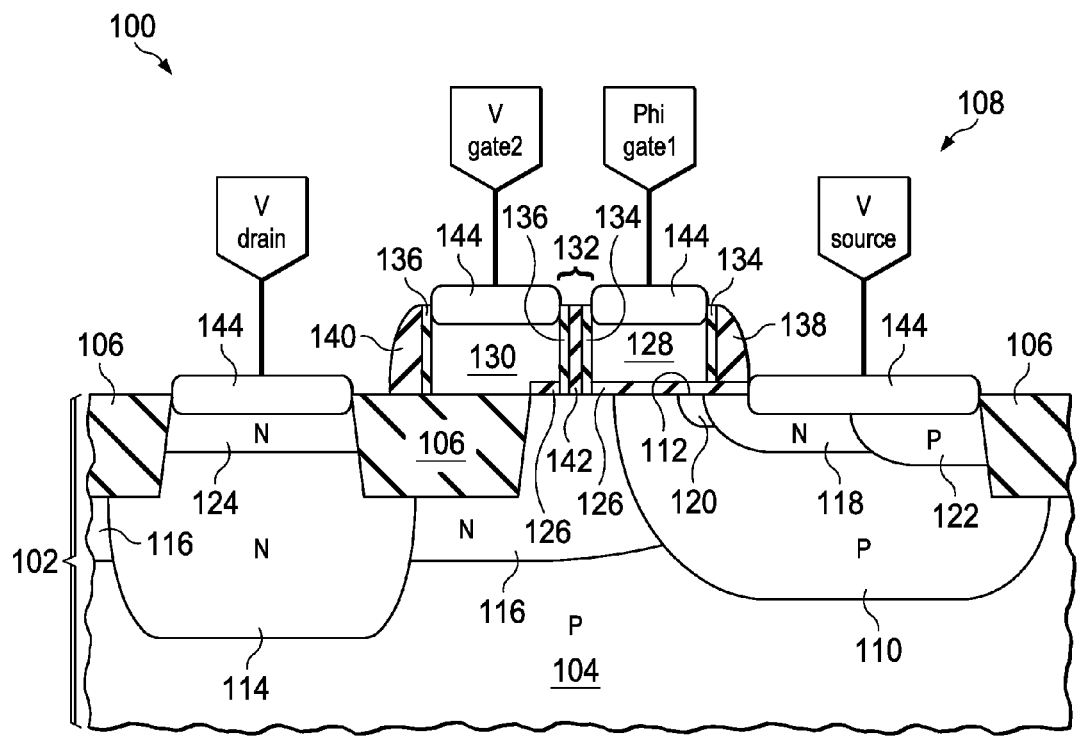
FIG. 1 is a cross section of an example semiconductor device including a split-gate transistor.

FIG. 1 is a cross section of an example semiconductor device including a split-gate transistor. An n-channel split-gate transistor will be described in the instant example. A p-channel split-gate transistor may be formed by appropriate changes in dopant types and conductivity types. The semiconductor device 100 includes a substrate 102 which may be from a silicon wafer or a wafer of another other semiconductor material. The substrate 102 includes a p-type semiconductor material 104 with a resistivity of, for example, 10 ohm-cm to 100 ohm-cm. In the instant example, the semiconductor device 100 includes field oxide 106 which has a shallow trench isolation (STI) structure, as depicted in FIG. 1. The field oxide 106 may be, for example, 300 nanometers to 600 nanometers thick. The split-gate transistor 108 includes a p-type body 110 in the substrate 102, extending to a top surface 112 of the substrate 102. The body 110 may have a dopant density of, for example, $3\times10^{15}$ cm$^{-3}$ to $3\times10^{16}$ cm$^{-3}$ at the top surface 112. The split-gate transistor 108 includes an n-type drain well 114 in the substrate 102. The drain well 114 may have an average dopant density of, for example, $1\times10^{17}$ cm$^{-3}$ to $1\times10^{18}$ cm$^{-3}$. The drain well 114 is laterally separated from the body 110 by an n-type drain drift region 116 of the split-gate transistor 108. The drain drift region 116 is disposed in the substrate 102 and extends to the top surface 112 abutting the body 110. The drain drift region 116 may have an average dopant density of, for example, 3 times to 10 times lower than the drain well 114. The split-gate transistor 108 further includes an n-type source 118 in the substrate 102 contacting the body 110, disposed opposite from the drain drift region 116. The source 118 may have an average dopant density of $1\times10^{19}$ cm$^{-3}$ to $1\times10^{21}$ cm$^{-3}$. An n-type source extension 120 may be disposed in the substrate 102 contiguous with the source 118 and contacting the body 110 at the top surface 112. A p-type halo region, not shown in FIG. 1, may be disposed in the body 110 adjacent to the source extension 120. A p-type body contact region 122 may be disposed in the body 110, extending to the top surface 112 of the substrate 102 adjacent to the source 118. The body contact region 122 may have an average dopant density of $1\times10^{19}$ cm$^{-3}$ to $1\times10^{21}$ cm$^{-3}$. An n-type drain contact region 124 may be disposed in the substrate 102 contacting the drain well 114, extending to the top surface 112 of the substrate 102. The drain contact region 124 may have a dopant distribution similar to the source 118 as a result of being formed concurrently.

The split-gate transistor 108 includes a gate dielectric layer 126 on the top surface 112 of the substrate 102, extending at least partially over the drain drift region 116, extending over the body 110 at the top surface 112 to the source 118, possibly partially overlapping the source 118. The gate dielectric layer 126 may be 1 nanometer to 5 nanometers thick, for example, and may include silicon dioxide, possibly with nitrogen, hafnium oxide and/or zirconium oxide. A first gate 128 is disposed over a portion of the gate dielectric layer 126. In the instant example, the first gate 128 is adjacent to, and may partially overlap, the source 118, and extends across the body 110 at the top surface 112 and partially overlaps the drain drift region 116. A second gate 130 is disposed over another portion of the gate dielectric layer 126. The second gate 130 is laterally separated from the first gate 128 by a gap 132 of 10 nanometers to 250 nanometers. The gate dielectric layer 126 may possibly be thinned or interrupted in the gap 132, as depicted in FIG. 1. In the instant example, the second gate 130 partially overlaps the drain drift region 116. In the instant example, a portion of the second gate 130 adjacent to the drain well 114 overlaps an element of the field oxide 106 disposed between the drain contact region 124 and the drain drift region 116, to reduce an electric field in the drain drift region 116 during operation of the split-gate transistor 108 and thus provide a higher breakdown voltage. Using the element of the field oxide 106 for this purpose may provide a lower cost structure for the semiconductor device 100 compared to other configurations for the second gate 130. First offset spacers 134 may be disposed on lateral surfaces of the first gate 128. The first offset spacers 134 may include one or more layers of silicon dioxide and/or silicon nitride, and may be 1 nanometer to 10 nanometers thick. Second offset spacers 136 may be disposed on lateral surfaces of the second gate 130. The second offset spacers 136 and the first offset spacers 134 may have a similar composition and structure, as a result of being formed concurrently. A first gate sidewall spacer 138 may be disposed adjacent to the first gate 128 opposite from the second gate 130. The first gate sidewall spacer 138 may include one or more layers of silicon dioxide and/or silicon nitride, and may be 5 nanometers to 50 nanometers thick. A second gate sidewall spacer 140 may be disposed adjacent to the second gate 130 opposite from the first gate 128. The second gate sidewall spacer 140 and the first gate sidewall spacer 138 may have a similar composition and structure, as a result of being formed concurrently. Dielectric material is disposed in the gap 132 between the first gate 128 and the second gate 130. The dielectric material may include portions of the first offset spacers 134 and the second offset spacers 136 and may also include additional dielectric material 142, for example material disposed during formation of the first gate sidewall spacer 138 and the second gate sidewall spacer 140. Voids may be disposed in the gap 132 as a result of incomplete filling of the dielectric material 142 in the gap 132.

The split-gate transistor 108 may be configured in a racetrack or finger layout, wherein the drain well 114 is laterally surrounded by the drain drift region 116, the body 110 and the source 118, respectively. The semiconductor device 100 may be an integrated circuit with a plurality of active components that are electrically coupled by metal interconnects over the top surface 112 of the substrate 102. Alternatively, the semiconductor device 100 may be a discrete component wherein the split-gate transistor 108 is the only active component.

Metal silicide 144 may be disposed on the source 118 and the body contact region 122, on the drain contact region 124, on the first gate 128 and on the second gate 130. The metal silicide 144 may include, for example, titanium silicide, cobalt silicide or nickel silicide. The source 118 is electrically coupled, through the metal silicide 144 if present, to a source voltage node Vsource of the semiconductor device 100 which, during operation of the semiconductor device 100, provides a constant voltage. Vsource may be a ground node of the semiconductor device 100. The drain well 114 is electrically coupled, through the drain contact region 124 and metal silicide 144 if present, to a drain voltage node Vdrain of the semiconductor device 100 which, during operation of the semiconductor device 100, provides a drain bias for the split-gate transistor 108. During operation of the semiconductor device 100, Vdrain may provide, for example, 12 volts to 16 volts bias to the split-gate transistor 108. Other voltage levels for Vdrain, significantly higher than 16 volts, are within the scope of the instant example. The first gate 128 is electrically coupled, through the metal silicide 144 if present, to a first gate signal node Phi_gate1 which, during operation of the semiconductor device 100, provides an alternating sequence of an off-state gate bias and an on-state gate bias to the first gate 128. The off-state gate bias may be substantially equal to the bias on the source 118, Vsource. The on-state gate bias may be 1.0 volts to 3 volts, significantly less than the bias on the drain well 114, Vdrain. In some versions of the instant example, the on-state gate bias may be substantially equal to an on-state logic gate bias used to turn on n-channel metal oxide semiconductor (NMOS) transistors in logic circuits in the semiconductor device 100. In one version of the instant example, the second gate 130 may be electrically coupled, through the metal silicide 144 if present, to a second gate voltage node Vgate2 of the semiconductor device 100, which, during operation of the semiconductor device 100, provides a constant on-state gate bias to the second gate 130, as depicted in FIG. 1. The on-state gate bias provided by Vgate2 may be substantially equal to the on-state gate bias provided by Phi_gate1. In another version of the instant example, the second gate 130 may be electrically coupled to a second gate signal node, which, during operation of the semiconductor device 100, provides an alternating sequence of an off-state gate bias and an on-state gate bias to the second gate 130 synchronized to the first gate signal node Phi_gate1. Providing the on-state gate bias to the second gate 130 generates an accumulation layer in the drain drift region 116 immediately under the gate dielectric layer 126 which advantageously provides a desired low resistance in the split-gate transistor 108. Providing the accumulation layer in the drain drift region 116 using the second gate 130 instead of the first gate 128 enables the first gate 128 to be shorter and so have a reduced capacitance to the substrate, which advantageously enables a higher operating frequency. Thus, the combination of the first gate 128 and the second gate 130 enables a desired higher operating frequency and a desired lower resistance for the split-gate transistor 108, compared to an analogous transistor with a single gate.

Figure 2A:
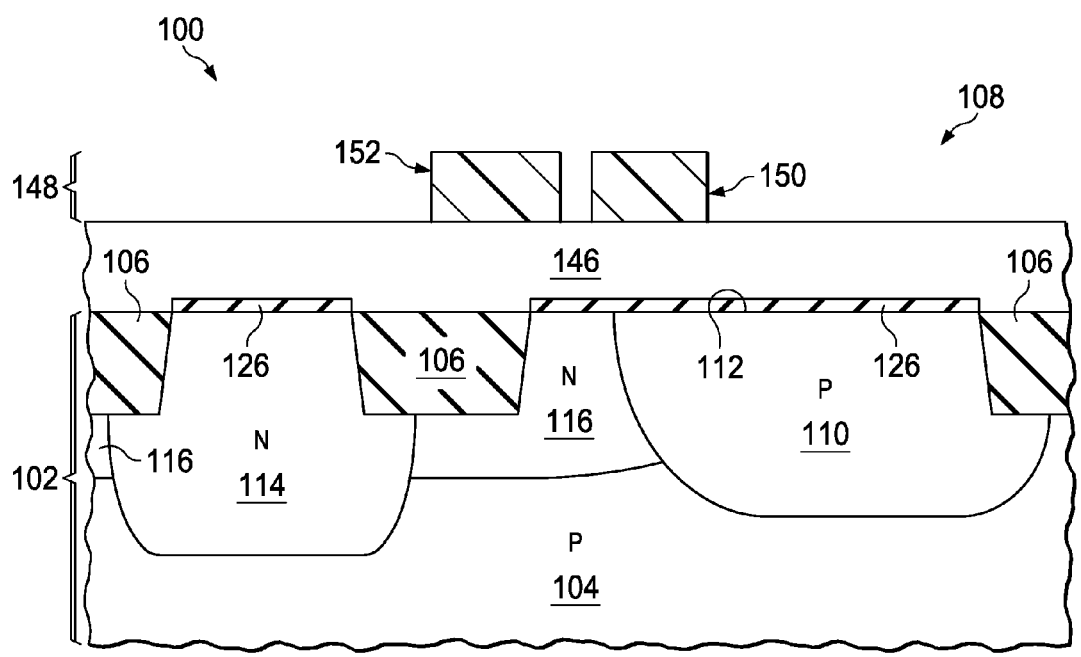
FIG. 2A through FIG. 2E are cross sections of the semiconductor device of FIG. 1, depicted in successive steps of an example method of formation.

FIG. 2A through FIG. 2E are cross sections of the semiconductor device of FIG. 1, depicted in successive steps of an example method of formation. Referring to FIG. 2A, the substrate 102 may include a semiconductor wafer such as a single crystal bulk silicon wafer, or may include a wafer of another semiconductor material. The p-type semiconductor material 104 may be a top portion of single crystal silicon wafer, or may be a top portion of one or more epitaxial layers of silicon or another semiconductor material on a silicon wafer. The field oxide 106 is formed at the top surface 112 of the substrate 102. In the instant example, the field oxide 106 is formed by an STI process; an example STI process includes forming a CMP stop layer of silicon nitride over the substrate 102, etching isolation trenches through the CMP stop layer and into the substrate 102, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a sub-atmospheric chemical vapor deposition (SACVD) process using dichlorosilane. Excess silicon dioxide is removed from over the CMP stop layer by an oxide chemical mechanical polish (CMP) process, and the CMP stop layer is subsequently removed, leaving the field oxide 106. Alternatively, the field oxide 106 may be formed by a localized oxidation of silicon (LOCOS) process.

The body 110 may be formed by implanting p-type dopants such as boron into the substrate 102 at a dose of $1\times10^{13}$ cm$^{-2}$ to $1\times10^{14}$ cm$^{-2}$ and an energy of 250 kiloelectron volts (keV) to 500 keV. The drain drift region 116 may be formed by implanting n-type dopants such as phosphorus into the substrate 102 at a dose of $3\times10^{11}$ cm$^{-2}$ to $3\times10^{12}$ cm$^{-2}$ and an energy of 300 keV to 600 keV. The drain well 114 may be formed by implanting n-type dopants such as phosphorus into the substrate 102 at a dose of $1\times10^{13}$ cm$^{-2}$ to $1\times10^{14}$ cm$^{-2}$ and an energy of 500 keV to 1000 keV. The implanted dopants may be activated by one or more anneal processes, such as a furnace anneal and/or a rapid thermal anneal.

The gate dielectric layer 126 may be formed by thermal oxidation of silicon at the top surface 112 of the substrate 102, followed by incorporation of nitrogen, to improve dielectric strength, from a plasma formed from ammonia gas (NH$_3$) and/or nitrogen gas (N$_2$) and possibly other gases. Hafnium oxide or zirconium oxide may be added to the gate dielectric layer 126 to increase a dielectric constant. The gate dielectric layer 126 as formed extends over all exposed semiconductor material at the top surface 112. A layer of gate material 146 is formed over the gate dielectric layer 126 and the field oxide 106. The layer of gate material 146 may include 200 nanometers to 500 nanometers of polycrystalline silicon, referred to as polysilicon, formed by thermal decomposition of silane and/or disilane. The layer of gate material 146 may be doped during formation to be n-type or may be substantially undoped.

A gate mask 148 is formed over the layer of gate material 146. The gate mask 148 includes a first mask element 150 and a second mask element 152. The first mask element 150 covers an area for the first gate 128 of FIG. 1 and the second mask element 152 covers an area for the second gate 130 of FIG. 1. In the instant example, the first mask element 150 and the second mask element 152 are separated by a gap and do not contact each other. The gate mask 148 may also cover areas for gates of other transistors of the semiconductor device 100. The gate mask 148 may include photoresist formed by a photolithographic process, and may optionally include an anti-reflection layer such as a bottom anti-reflection coat (0) and/or a hard mask layer of silicon nitride or amorphous carbon.

Figure 2B:
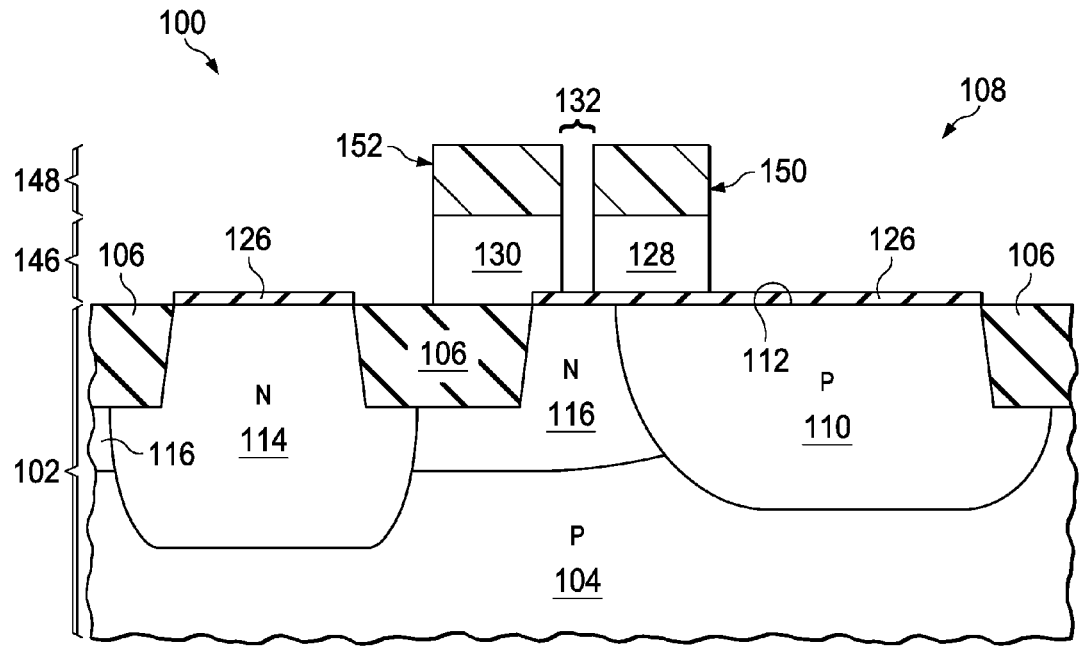

Referring to FIG. 2B, a gate etch process such as a reactive ion etch (RIE) process removes the layer of gate material 146 where exposed by the gate mask 148, leaving gates of the semiconductor device 100, including the first gate 128 and the second gate 130 of the split-gate transistor 108. In the instant example, after the gate etch process is completed, the first gate 128 and the second gate 130 are separated by the gap 132 and do not contact each other. The gate mask 148 is subsequently removed. Photoresist and amorphous carbon in the gate mask 148 may be removed by an ash process followed by a wet clean process. Other hard mask material in the gate mask 148 may be removed by a plasma etch process which is selective to the gates 128 and 130 and to silicon dioxide. Forming the first gate 128 and the second gate 130 concurrently as disclosed in the instant example may advantageously provide reduced fabrication cost and complexity for the semiconductor device 100.

Figure 2C:
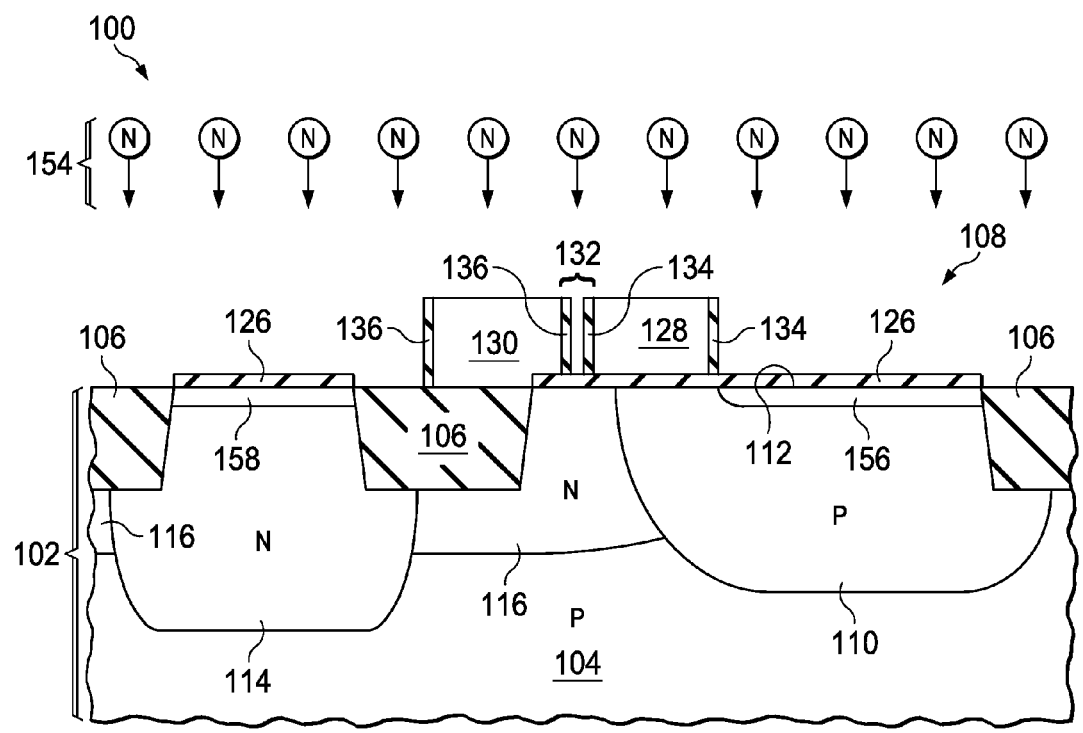

Referring to FIG. 2C, the first offset spacers 134 are formed on the first gate 128 and the second offset spacers 136 are formed on the second gate 130. The offset spacers 134 and 136 may be formed by thermally oxidizing the first gate 128 and second gate 130 to form a thin layer of silicon dioxide, 0.5 nanometers to 1.5 nanometers thick, followed by formation of one or more conformal layers of silicon dioxide and/or silicon nitride. Conformal layers of silicon dioxide may be formed by chemical vapor deposition (CVD) processes using TEOS. Conformal layers of silicon nitride may be formed by CVD processes using bis(tertiary-butylamino) silane (BTBAS). The layers are subsequently removed from the top surfaces of the gates 128 and 130 and from horizontal surfaces of the substrate 102 by an anisotropic plasma etch process such as an RIE process, leaving the offset spacers 134 and 136 in place.

N-type dopants 154 such as phosphorus and arsenic, and possibly antimony, are implanted into the substrate 102 to form a source extension implanted region 156 adjacent to the first gate 128 and a drain contact extension implanted layer 158 in the substrate 102 contacting the drain well 114. The n-type dopants 154 may be implanted with a total dose of $1\times10^{13}$ cm$^{-2}$ to $1\times10^{14}$ cm$^{-2}$ and a low energy to provide a desired shallow depth of the source extension implanted region 156. The first offset spacers 134 provide a desired lateral offset of the source extension implanted region 156 relative to the first gate 128. In one version of the instant example, the n-type dopants 154 may be implanted through the gap 132 between the first gate 128 and the second gate 130. In another version, the gap 132 may be blocked by an element of an optional source/drain extension mask or by inorganic dielectric material, not shown in FIG. 2C. P-type dopants may optionally be implanted at an angle to form a halo implanted region under the first gate 128 adjacent to the source extension implanted region 156. The source/drain extension mask, if present, is removed and the substrate 102 is subsequently annealed to activate the implanted n-type dopants 154 to form the source extension 120 of FIG. 1.

Figure 2D:
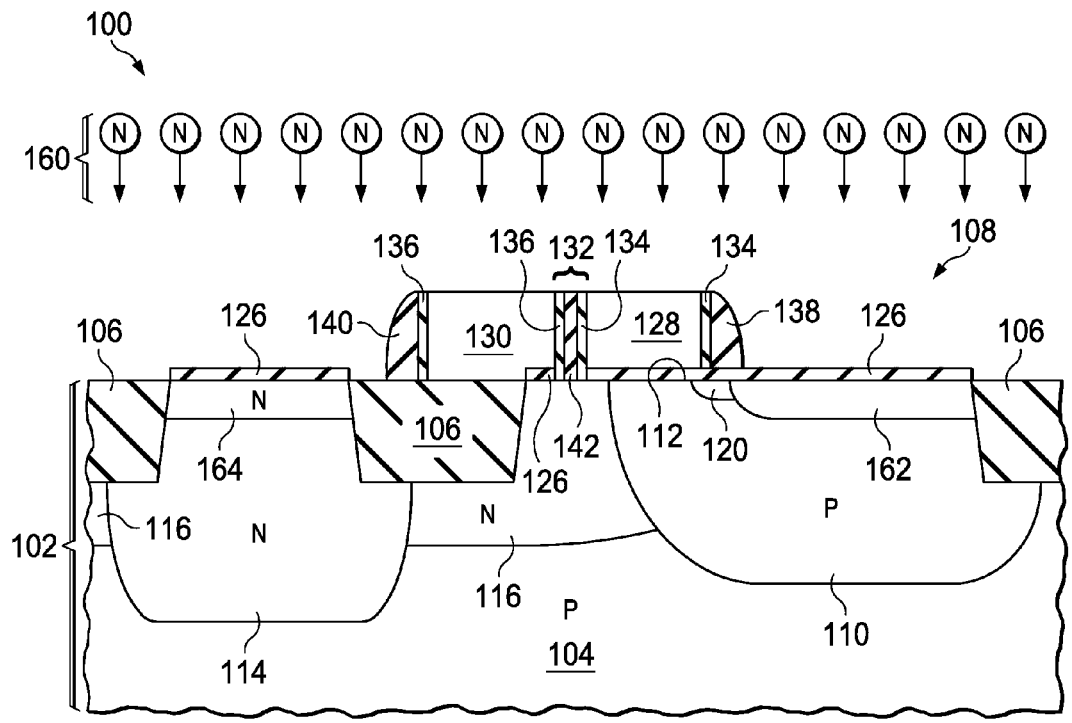

Referring to FIG. 2D, the first gate sidewall spacer 138 is formed adjacent to the first gate 128 and the second gate sidewall spacer 140 is formed adjacent to the second gate 130. The gate sidewall spacers 138 and 140 may be formed by forming one or more conformal layers of silicon nitride and/or silicon dioxide over the gates 128 and 130 and over the substrate 102. Conformal layers of silicon nitride and silicon dioxide may be formed by CVD processes using BTBAS and TEOS, respectively. The additional dielectric material 142 in the gap 132 between the first gate 128 and the second gate 130 may be formed concurrently with the first gate sidewall spacer 138 and the second gate sidewall spacer 140. Voids may be formed in the gap 132 as a result of incomplete filling of the gap 132 by the CVD processes.

N-type dopants 160 such as phosphorus and arsenic, and possibly antimony, are implanted into the substrate 102 to form a source implanted region 162 adjacent to the first gate 128 and a drain contact implanted region 164 in the substrate 102 contacting the drain well 114. The n-type dopants 160 may be implanted with a total dose of $3 \times 10^{14}$ cm$^{-2}$ to $1 \times 10^{16}$ cm$^{-2}$ and an energy to provide a desired depth of the source implanted region 162. The first gate sidewall spacer 138 provides a desired lateral offset of the source implanted regions 162 relative to the first gate 128. The additional dielectric material 142 in the gap 132 between the first gate 128 and the second gate 130 blocks the n-type dopants 160 from the substrate 102. The substrate 102 is subsequently annealed to activate the implanted n-type dopants 160 to form the source 118 and the drain contact region 124 of FIG. 1.

Figure 2E:
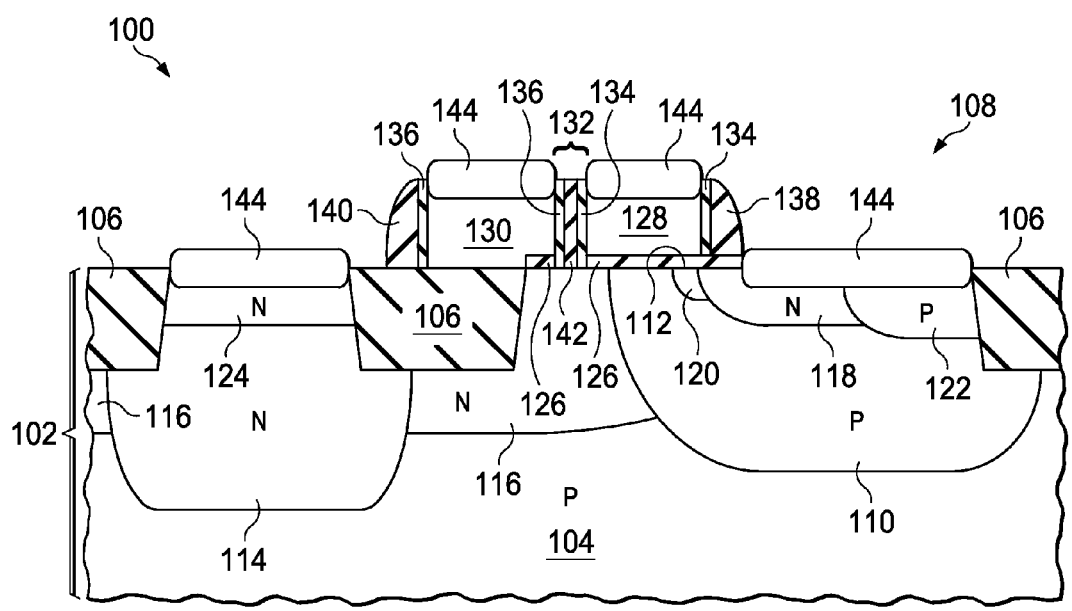

Referring to FIG. 2E, the body contact region 122 is formed by implanting p-type dopants such as boron into the substrate 102 with a total dose of $3 \times 10^{14}$ cm$^{-2}$ to $3 \times 10^{15}$ cm$^{-2}$ and an energy to provide a desired depth of the body contact region 122. The metal silicide 144 is subsequently formed on the source 118 and the body contact region 122, on the drain contact region 124, on the first gate 128 and on the second gate 130. An example process for forming the metal silicide 144 includes forming a layer of refractory metal such as titanium, nickel with a few percent platinum, or cobalt on an existing top surface of the semiconductor device 100, so that the refractory metal contacts exposed silicon on the source 118 and the body contact region 122, on the drain contact region 124, on the first gate 128 and on the second gate 130. A cap layer of titanium nitride may be formed over the refractory metal to provide a diffusion barrier. The refractory metal is subsequently heated, for example in a rapid thermal processor, to react the refractory metal with the exposed silicon to form the metal silicide 144. Unreacted refractory metal is removed, for example by a wet etch using aqueous solutions of acidic or basic reagents. The metal silicide 144 may be subsequently annealed to provide a desired crystalline phase. The metal silicide 144 does not extend across the gap 132.

Figure 3A:
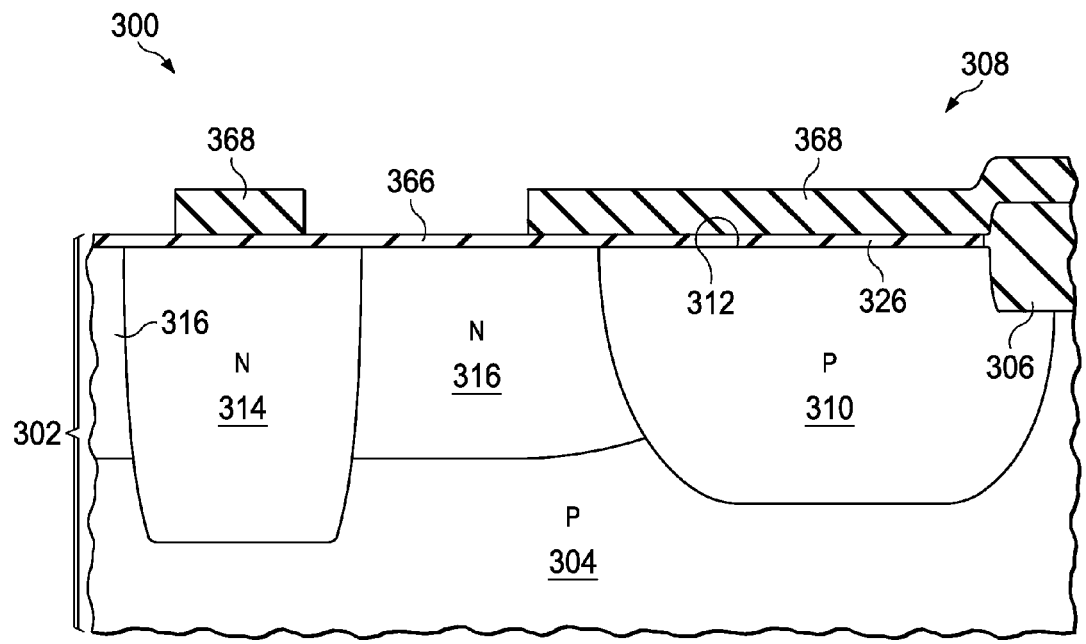
FIG. 3A through FIG. 3H are cross sections of another example semiconductor device with a split-gate transistor, depicted in successive steps of an example method of formation.

FIG. 3A through FIG. 3I are cross sections of another example semiconductor device with a split-gate transistor, depicted in successive steps of an example method of formation. An n-channel split-gate transistor will be described in the instant example. A p-channel split-gate transistor may be formed by appropriate changes in dopant types and conductivity types. Referring to FIG. 3A, the semiconductor device 300 includes a substrate 302 with a p-type semiconductor material 304 as described in reference to FIG. 1. The p-type semiconductor material 304 may be a top portion of single crystal silicon wafer, or may be a top portion of one or more epitaxial layers of silicon or another semiconductor material on a silicon wafer. Field oxide 306 is formed at a top surface 312 of the substrate 302. The field oxide 306 may be, for example, 300 nanometers to 600 nanometers thick. In the instant example, the field oxide 306 is formed by a LOCOS process; an example LOCOS process includes forming silicon nitride layer over the top surface of the substrate 302 and patterning the silicon nitride layer to expose areas for the field oxide 306. The field oxide 306 is formed by thermal oxidation and the silicon nitride layer is subsequently removed, leaving the field oxide 306. Alternatively, the field oxide 306 may be formed by an STI process.

The split-gate transistor 308 includes a p-type body 310 in the substrate 302, extending to a top surface 312 of the substrate 302, with a dopant density of, for example, $3 \times 10^{15}$ cm$^{-3}$ to $3 \times 10^{16}$ cm$^{-3}$ at the top surface 312. The split-gate transistor 308 includes an n-type drain well 314 in the substrate 302, with an average dopant density of, for example, $1 \times 10^{17}$ cm$^{-3}$ to $1 \times 10^{18}$ cm$^{-3}$. The drain well 314 is laterally separated from the body 310 by an n-type drain drift region 316 of the split-gate transistor 308, disposed in the substrate 302 and extending to the top surface 312 adjacent to the body 310. The drain drift region 316 may have an average dopant density of, for example, 3 times to 10 times lower than the drain well 314. The body 310, the drain well 314 and the drain drift region 316 may be formed as described in reference to FIG. 2A.

A pad oxide layer 366 may be formed on the top surface 312 of the substrate 302, for example by thermal oxidation of silicon at the top surface 312 of the substrate 302. The pad oxide layer 366 may be 5 nanometers to 20 nanometers thick. An oxidation mask 368 of silicon nitride, 20 nanometers to 100 nanometers thick, is formed over the pad oxide layer 366 and the field oxide 306. The oxidation mask 368 exposes an area which overlaps a boundary between the drain drift region 316 and the drain well 314. The oxidation mask 368 may be formed by a low pressure chemical vapor deposition (LPCVD) process using dichlorosilane and ammonia. The oxidation mask 368 may be patterned by forming a mask of photoresist and etching the silicon nitride using an RIE process which is selective to the pad oxide layer 366. The mask of photoresist is subsequently removed.

Figure 3B:
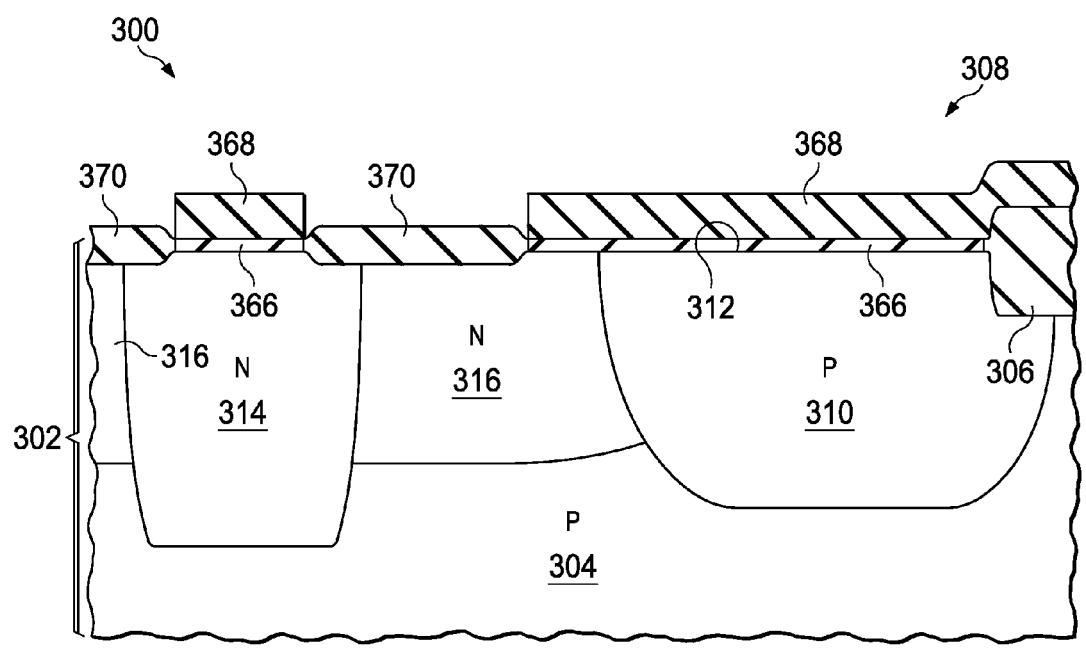

Referring to FIG. 3B, thin field oxide 370 is formed at the top surface 312 of the substrate 302 in the areas exposed by the oxidation mask 368. The thin field oxide 370 may be less than half as thick as the field oxide 306. The thin field oxide 370 may be, for example, 50 nanometers to 150 nanometers thick, and may be formed by thermal oxidation of silicon in the substrate 302. The oxidation mask 368 is subsequently removed, for example by an aqueous solution of hot phosphoric acid. The thin field oxide 370 does not extend to the body 310. The pad oxide layer 366 is subsequently removed, for example by a timed etch in an aqueous solution of buffered hydrofluoric acid.

In an alternate version of the instant example, the thin field oxide 370 may be formed by forming thin oxide at exposed areas of the substrate 302 at the top surface 312, followed by forming an etch mask over the thin oxide which covers areas for the thin field oxide 370. The thin oxide is removed from areas exposed by the etch mask using an aqueous buffered solution of hydrofluoric acid, leaving the thin filed oxide 370 in place. The etch mask is subsequently removed. Other methods of forming the thin field oxide 370 are within the scope of the instant example.

Figure 3C:
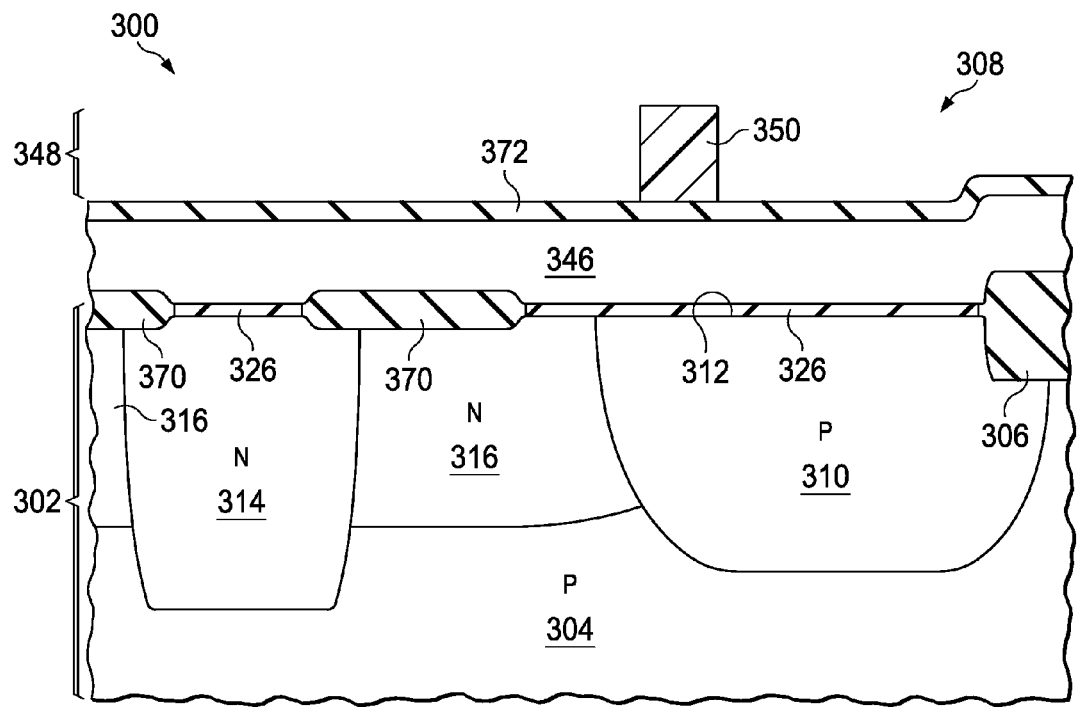

Referring to FIG. 3C, a gate dielectric layer 326 is formed at the top surface 312 of the substrate 302 in areas which are not covered by the field oxide 306 and the thin field oxide 370, in particular an area extending over the boundary between the drain drift region 316 and the drain well 314 at the top surface 312, partially overlapping the drain drift region 316 and partially overlapping the body 310. The gate dielectric layer 326 may be formed as described in reference to FIG. 2A.

A first layer of gate material 346 is formed over the gate dielectric layer 326, the thin field oxide 370 and the field oxide 306. The first layer of gate material 346 may include, for example, 200 nanometers to 500 nanometers of polysilicon. The first layer of gate material 346 may be doped during formation to be n-type or may be substantially undoped. An etch stop layer 372 may be formed over the first layer of gate material 346. The etch stop layer 372 may include, for example 10 nanometers to 50 nanometers of silicon dioxide and/or silicon nitride, formed by PECVD processes.

A first gate mask 348 is formed over the first layer of gate material 346. The first gate mask 348 includes a first mask element 350 which covers an area for a first gate of the split-gate transistor 308. In the instant example, the first mask element 350 is located over a portion of the body 310 and does to extend to the boundary between the drain drift region 316 and the drain well 314 at the top surface 312. The first gate mask 348 may also cover areas for gates of other transistors of the semiconductor device 300. The first gate mask 348 may be formed as described in reference to FIG. 2A.

Figure 3D:
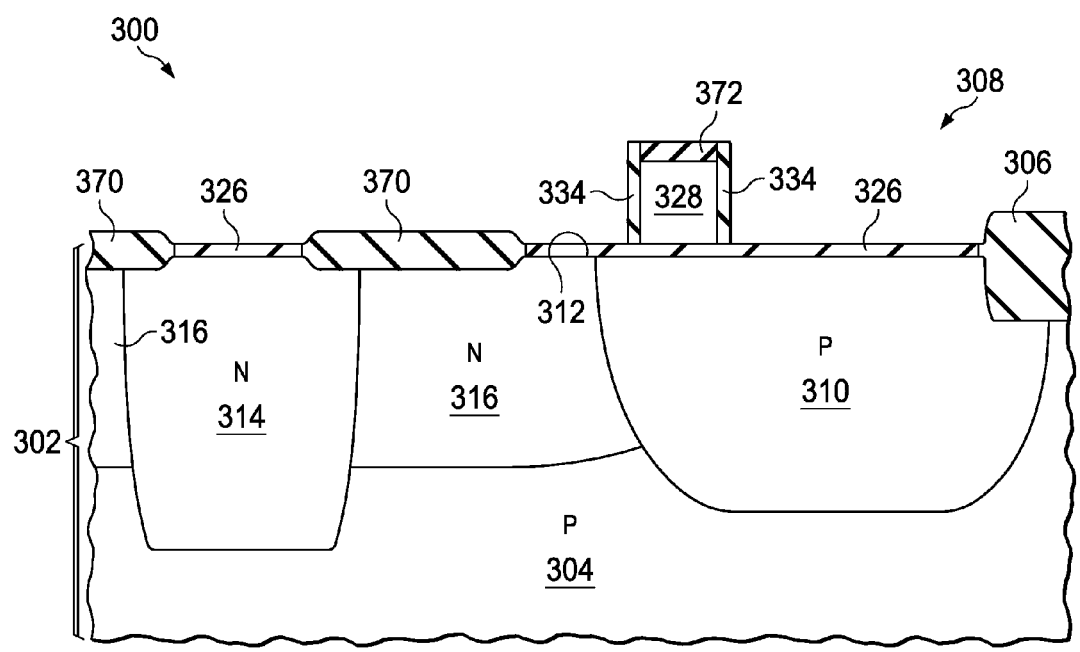

Referring to FIG. 3D, a first gate etch process removes the etch stop layer 372 and the first layer of gate material 346 of FIG. 3C where exposed by the first gate mask 348, leaving gates of the semiconductor device 300, including the first gate 328 of the split-gate transistor 308. In the instant example, the first gate 328 is located over a portion of the body 310 and does not extend to the boundary between the drain drift region 316 and the drain well 314 at the top surface 312. The first gate mask 348 is subsequently removed, for example as described in reference to FIG. 2B.

First offset spacers 334 are formed on the first gate 328. The first offset spacers 334 may be formed by thermally oxidizing the first gate 328 to form a thin layer of silicon dioxide, followed by formation of one or more conformal layers of silicon dioxide and/or silicon nitride. The layers are subsequently removed from the top surface of the first gate 328 and from horizontal surfaces of the substrate 302 by an anisotropic plasma etch process, leaving the first offset spacers 334 in place. The first offset spacers may be 10 nanometers to 100 nanometers thick, to reduce a capacitance between the first gate 328 and a subsequently-formed second gate of the split-gate transistor 308. At least a portion of the etch stop layer 372 is left on the first gate 328 to electrically isolate the first gate 328 from the subsequently-formed second gate.

Figure 3E:
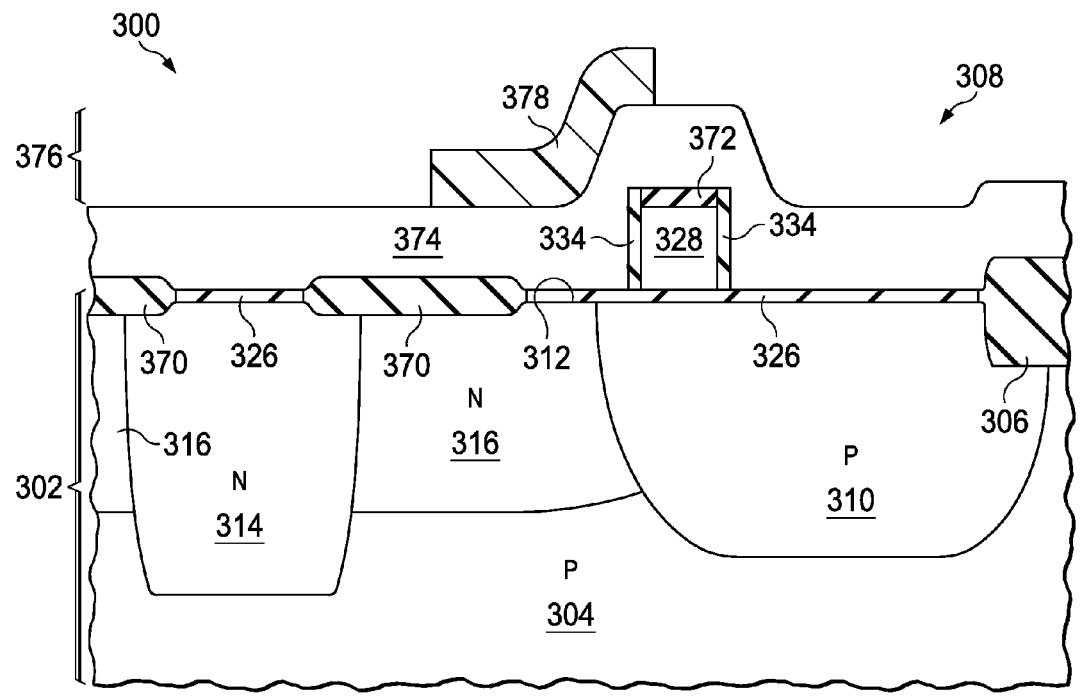

Referring to FIG. 3E, a second layer of gate material 374 is formed over the first gate 328 and over the gate dielectric layer 326, the thin field oxide 370 and the field oxide 306. The second layer of gate material 374 may have a composition and structure similar to that of the first layer of gate material 346 of FIG. 3C. The second layer of gate material 374 is electrically isolated from the first gate 328 by a combination of the first offset spacers 334 and the etch stop layer 372.

A second gate mask 376 is formed over the second layer of gate material 374. The second gate mask 376 includes a second mask element 378 which covers an area for the second gate of the split-gate transistor 308. In the instant example, the second mask element 378 partially overlaps the first gate 328 and extends over the boundary between the drain drift region 316 and the drain well 314 at the top surface 312, and partially overlaps the thin field oxide 370. The second gate mask 376 may also cover areas for gates of other transistors of the semiconductor device 300. The second gate mask 376 may be formed as described in reference to FIG. 2A.

Figure 3F:
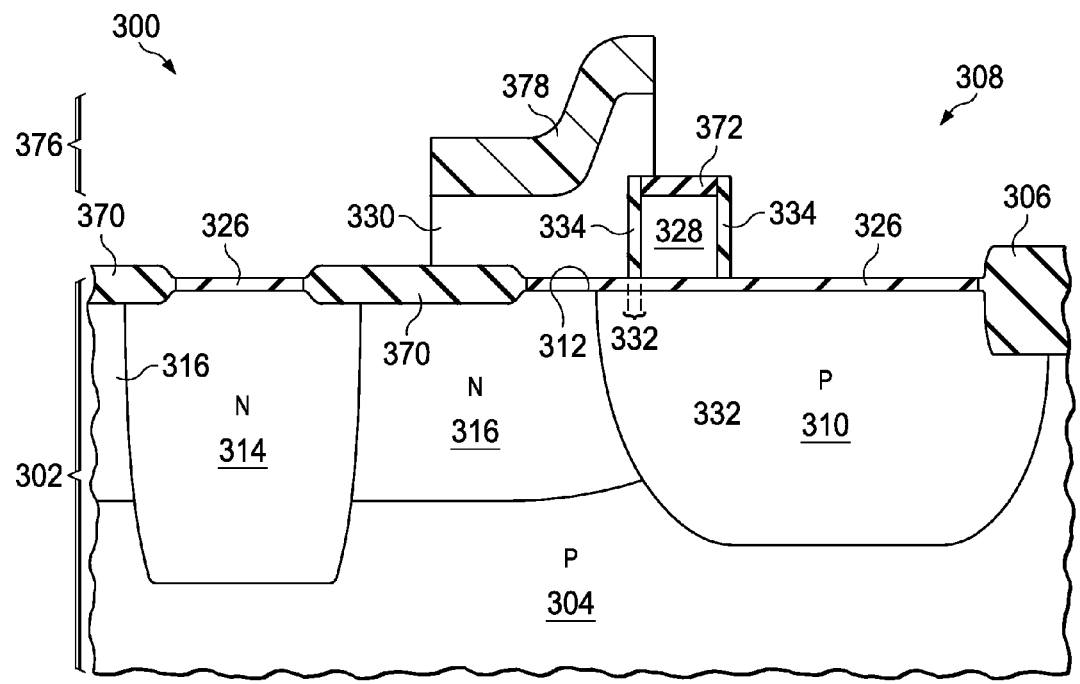

Referring to FIG. 3F, a second gate etch process removes the second layer of gate material 374 of FIG. 3E where exposed by the second gate mask 376, leaving gates of the semiconductor device 300, including the second gate 330 of the split-gate transistor 308. In the instant example, the second gate 330 partially overlaps the first gate 328 and extends over the boundary between the drain drift region 316 and the body 310 at the top surface 312, and extends to, and partially overlaps, the thin field oxide 370. The second gate 330 is electrically isolated from the first gate 328 by a combination of the first offset spacers 334 and the etch stop layer 372. The first gate 328 is laterally separated from the second gate 330 by a gap 332. In the instant example, dielectric material of the first offset spacers 334 is formed in the gap 332. Forming the first gate 328 and the second gate 330 as described in the instant example, wherein the gap 332 is substantially defined by a thickness of the first offset spacers 334, may provide the gap 332 being less than 100 nanometers wide. Such a narrow gap 332 may enable the first gate 328 and the second gate 330 to provide a low resistance inversion layer in the body 310 immediately below the gate dielectric layer 326 during operation of the split-gate transistor 308. A low resistance layer may advantageously provide a lower series resistance of the split-gate transistor 308. In an alternate version of the instant example, the second gate 330 may be formed before the first gate 328, so that the first gate 328 partially overlaps the second gate 330, accruing similar advantages. The second gate mask 376 is subsequently removed, for example as described in reference to FIG. 2B.

Figure 3G:
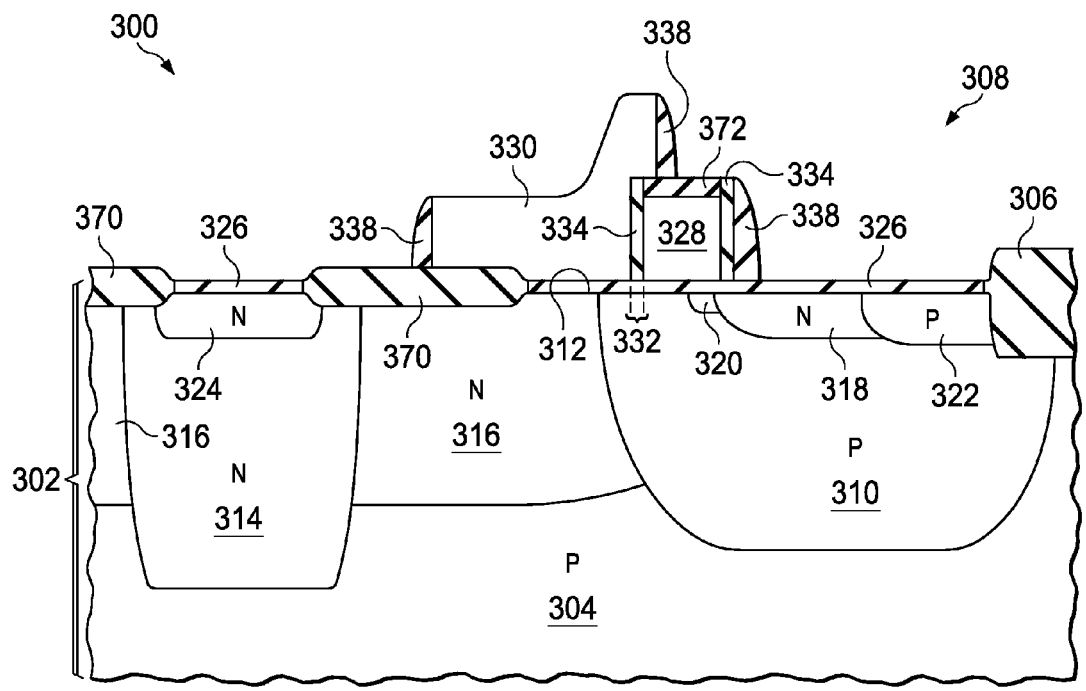

Referring to FIG. 3G, an n-type source extension 320 is formed in the substrate 302 partially underlapping the first gate 328. The source extension 320 may be formed as described in reference to FIG. 2C. Gate sidewall spacers 338 are formed adjacent to vertical surfaces of the first gate 328 and the second gate 330. The gate sidewall spacers 338 may be formed as described in reference to FIG. 2D. An n-type source 318 is formed in the substrate 302 contacting the body 310, disposed opposite from the drain drift region 316. An n-type drain contact region 324 is formed in the substrate 302 contacting the drain well 314. The source 318 and drain contact region 324 may be formed concurrently, for example as described in reference to FIG. 2D. In a version of the instant example wherein the second gate 330 does not extend as far as the drain well 314, such as depicted in FIG. 3G, n-type dopants implanted into the substrate 302 to form the source 318 may be implanted at an energy sufficiently low so that the thin field oxide 370 effectively blocks the n-type dopants from the drain drift region 316. In another version of the instant example, the n-type dopants may be blocked from the drain drift region 316 by an element of an implant mask used to define implanted areas for the n-type dopants. In a further version, the second gate 330 may extend as far as the drain well 314, so that a combination of the second gate 330 and the thin field oxide 370 effectively blocks the n-type dopants from the drain drift region 316. A p-type body contact region 322 may be formed in the body 310, extending to the top surface 312 of the substrate 302 adjacent to the source 318, for example as described in reference to FIG. 2D.

Figure 3H:
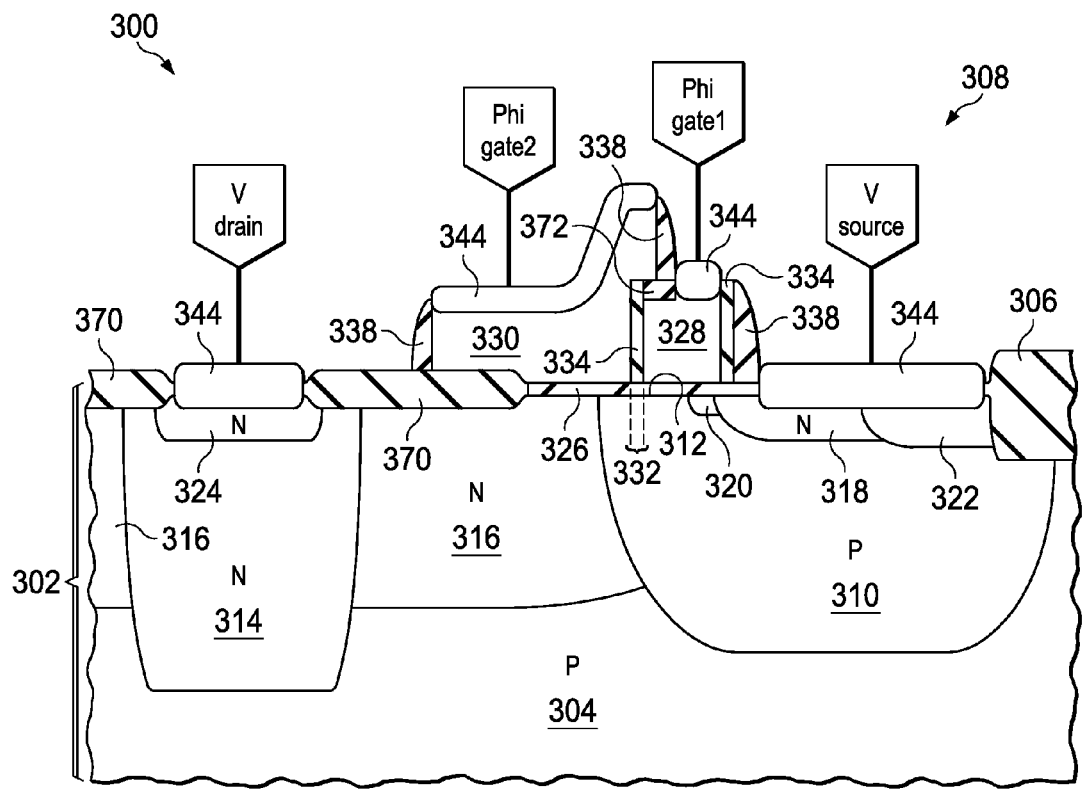

Referring to FIG. 3H, metal silicide 344 may be subsequently formed on the source 318 and the body contact region 322, on the drain contact region 324, on the first gate 328 and on the second gate 330. The source 318 is electrically coupled, through the metal silicide 344 if present, to a source voltage node Vsource of the semiconductor device 300 which, during operation of the semiconductor device 300, provides a constant voltage. The drain well 314 is electrically coupled, through the drain contact region 324 and metal silicide 344 if present, to a drain voltage node Vdrain of the semiconductor device 300 which, during operation of the semiconductor device 300, provides a drain bias for the split-gate transistor 308. The first gate 328 is electrically coupled, through the metal silicide 344 if present, to a first gate signal node Phi_gate1 which, during operation of the semiconductor device 300, provides an alternating sequence of an off-state gate bias and an on-state gate bias to the first gate 328. The on-state gate bias may be 1.0 volts to 3 volts, significantly less than the bias on the drain well 314, Vdrain. In one version of the instant example, the second gate 330 may be electrically coupled, through the metal silicide 344 if present, to a second gate signal node Phi_gate2 as depicted in FIG. 3H, which, during operation of the semiconductor device 300, provides an alternating sequence of an off-state gate bias and an on-state gate bias to the second gate 330, synchronized to the first gate signal node Phi_gate1. The on-state gate bias provided by Phi_gate2 may be substantially equal to the on-state gate bias provided by Phi_gate1. In another version of the instant example, the second gate 330 may be electrically coupled to a second gate voltage node Vgate2 of the semiconductor device 300, which, during operation of the semiconductor device 300, provides a constant on-state gate bias to the second gate 330. Providing the on-state gate bias to the second gate 330 generates an accumulation layer in both the drain drift region 316 and in the body 310 immediately under the gate dielectric layer 326 which advantageously provides a desired low resistance in the split-gate transistor 308, accruing the advantage of low series resistance as disclosed in reference to FIG. 1. The thin field oxide 370 may provide a lower electric field in the drain drift region 316 under the second gate 330 than a comparable split-gate transistor with a thicker field oxide under the second gate, advantageously providing higher breakdown voltage and lower resistance for the split-gate transistor 308.

Figure 4:
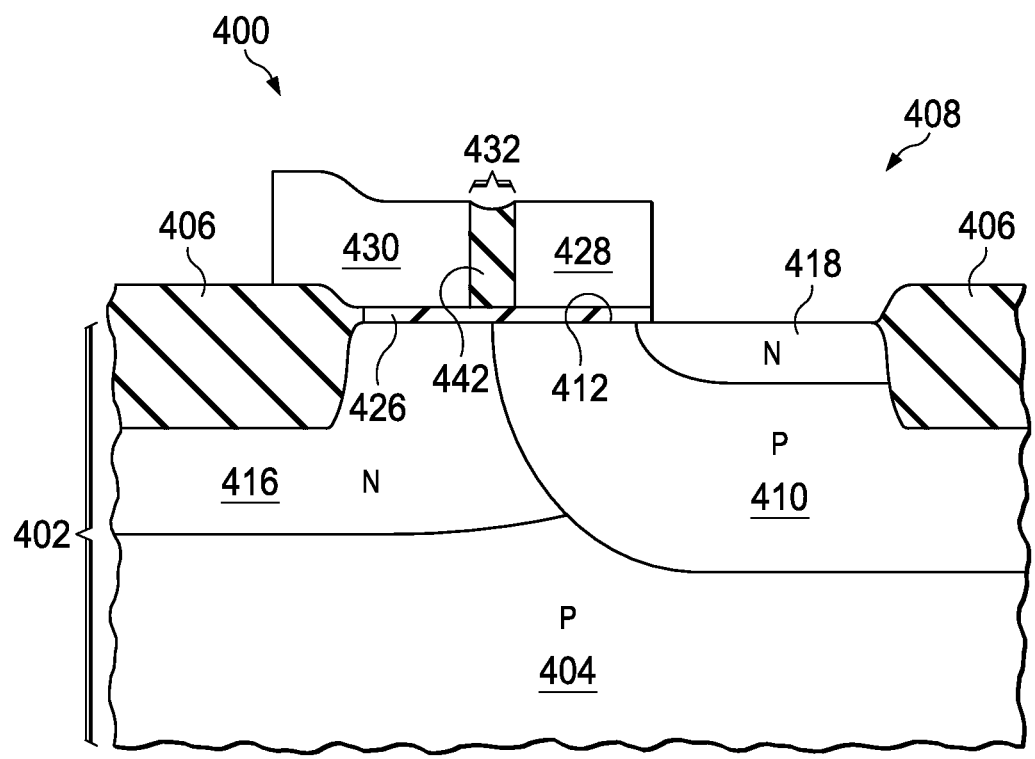
FIG. 4 is a cross section of a further example semiconductor device including a split-gate transistor.

FIG. 4 is a cross section of a further example semiconductor device including a split-gate transistor. An n-channel split-gate transistor will be described in the instant example. A p-channel split-gate transistor may be formed by appropriate changes in dopant types and conductivity types. The semiconductor device 400 includes a substrate 402 including a p-type semiconductor material 404, for example as described in reference to FIG. 1. In the instant example, the semiconductor device 400 includes field oxide 406 which has a LOCOS structure, as depicted in FIG. 4. Field oxide with an STI structure is within the scope of the instant example. The split-gate transistor 408 includes a p-type body 410 in the substrate 402, extending to a top surface 412 of the substrate 402. The split-gate transistor 408 includes an n-type drain drift region 416 of a drain of the split-gate transistor 408; the drain drift region 416 is disposed in the substrate 402, abutting the body 410 at the top surface 412. The split-gate transistor 408 further includes an n-type source 418 in the substrate 402 contacting the body 410, disposed opposite from the drain drift region 416.

The split-gate transistor 408 includes a gate dielectric layer 426 on the top surface 412 of the substrate 402. The gate dielectric layer 426 at least partially overlaps the drain drift region 416, extending over the body 410 at the top surface 412 to the source 418, possibly partially overlapping the source 418. A first gate 428 is disposed on a first portion of the gate dielectric layer 426, and a second gate 430 is disposed on a second portion of the gate dielectric layer 426, laterally adjacent to the first gate 428. In the instant example, the first gate 428 is adjacent to, and may partially overlap, the source 418, and extends across the body 410 at the top surface 412, and terminates proximate to the drain drift region 416. The second gate 430 extends across the drain drift region 416 at the top surface 412 and terminates proximate to the body 410. In the instant example, a portion of the second gate 430 overlaps an element of the field oxide 406 disposed over the drain drift region 416. The second gate 430 is laterally separated from the first gate 428 by a gap 432 of 10 nanometers to 250 nanometers. Dielectric material 442 is disposed in the gap 432. Voids may be disposed in the gap 432 as a result of incomplete filling of the dielectric material 442 in the gap 432. In the instant example, a boundary between the body 410 and the drain drift region 416 at the top surface 412 of the substrate 402 is located under the gap 432.

The first gate 428 is electrically coupled to a first gate signal node which, during operation of the semiconductor device 400, provides an alternating sequence of an off-state gate bias and an on-state gate bias to the first gate 428. In one version of the instant example, the second gate 430 may be electrically coupled to a second gate voltage node of the semiconductor device 400, which, during operation of the semiconductor device 400, provides a constant on-state gate bias to the second gate 430. In another version of the instant example, the second gate 430 may be electrically coupled to a second gate signal node which, during operation of the semiconductor device 400, provides an alternating sequence of an off-state gate bias and an on-state gate bias to the second gate 430 synchronized to the first gate signal. The split-gate transistor 408 accrues the advantages discussed in reference to the other examples disclosed herein.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A semiconductor device, comprising:
 a substrate comprising a semiconductor material, the semiconductor material being p-type; and
 a split-gate transistor, comprising:
  a body disposed in the substrate and extending to a top surface of the substrate, the body being p-type;
  a drain drift region disposed in the substrate and abutting the body, the drain drift region being n-type, a boundary between the drain drift region and the body extending to the top surface of the substrate;
  a drain well region disposed in the substrate and abutting the drain drift region, the drain well region extending deeper into the substrate than the drain drift region and having a dopant concentration greater than the drain drift region;
  a drain region disposed in the drain well region;
  a gate dielectric layer disposed over the top surface of the substrate, the gate dielectric layer being located over the boundary between the drain drift region and the body at the top surface of the substrate, the gate dielectric layer extending at least partially over the body and extending at least partially over the drain drift region;

a first gate disposed over the gate dielectric layer, the first gate extending at least partially over the body; and a second gate disposed over the gate dielectric layer, laterally adjacent to the first gate, the second gate extending at least partially over the drain drift region, a first portion of the second gate being vertically separated from the drain drift region by a field oxide and a second portion of the second gate being vertically separated from the drain drift region by the gate dielectric layer and not the field oxide, the second gate being laterally separated from the first gate by a gap of 10 nanometers to 250 nanometers, wherein a boundary between the body and the drain drift region at the top surface of the substrate is located under at least one of the first gate, the second gate and the gap between the first gate and the second gate.

2. The semiconductor device of claim 1, dielectric material being disposed in the gap between the first gate and the second gate.

3. The semiconductor device of claim 1, the boundary between the body and the drain drift region at the top surface of the substrate being located under the first gate.

4. A semiconductor device, comprising:
a substrate comprising a semiconductor material, the semiconductor material being p type; and
a split gate transistor, comprising:
a body disposed in the substrate and extending to a top surface of the substrate, the body being p type;
a drain drift region disposed in the substrate and abutting the body, the drain drift region being n type, a boundary between the drain drift region and the body extending to the top surface of the substrate;
a gate dielectric layer disposed over the top surface of the substrate, the gate dielectric layer being located over the boundary between the drain drift region and the body at the top surface of the substrate, the gate dielectric layer extending at least partially over the body and extending at least partially over the drain drift region;
a first gate disposed over the gate dielectric layer, the first gate extending at least partially over the body; and
a second gate disposed over the gate dielectric layer, laterally adjacent to the first gate, the second gate extending at least partially over the drain drift region, wherein the boundary between the body and the drain drift region at the top surface of the substrate is located under the second gate and not under the first gate.

5. The semiconductor device of claim 1, the boundary between the body and the drain drift region at the top surface of the substrate being located under the gap between the first gate and the second gate.

6. The semiconductor device of claim 1, wherein the first gate does not overlap the second gate and the second gate does not overlap the first gate.

7. The semiconductor device of claim 1, wherein one of the first gate and the second gate overlaps the other of the first gate and the second gate.

8. The semiconductor device of claim 1, wherein the second gate is electrically coupled to a gate voltage node of the semiconductor device.

9. The semiconductor device of claim 1, wherein the second gate is electrically coupled to a gate signal node of the semiconductor device.

10. A method of forming a semiconductor device, comprising the steps:
providing a substrate comprising a p-type semiconductor material;
forming a drain drift region of a split-gate transistor of the semiconductor device in the substrate, the drain drift region being n-type, the drain drift region abutting a body of the split-gate transistor, the body being p-type;
forming a drain well region abutting the drain drift region, the drain well region being n type and having a dopant concentration greater than the drain drift region, the drain well region extending deeper into the substrate than the drain drift region;
forming a gate dielectric layer of the split-gate transistor over a top surface of the substrate, the gate dielectric layer being located over the boundary between the drain drift region and the body at the top surface of the substrate, the gate dielectric layer extending at least partially over the body and extending at least partially over the drain drift region;
forming a first gate of the split-gate transistor over the gate dielectric layer, the first gate extending at least partially over the body; and
forming a second gate of the split-gate transistor over the gate dielectric layer, laterally adjacent to the first gate, the second gate extending at least partially over the drain drift region, a first portion of the second gate being vertically separated from the drain drift region by a field oxide and a second portion of the second gate being vertically separated from the drain drift region by the gate dielectric layer and not the field oxide, the second gate being laterally separated from the first gate by a gap of 10 nanometers to 250 nanometers, wherein a boundary between the body and the drain drift region at the top surface of the substrate is located under at least one of the first gate, the second gate and the gap between the first gate and the second gate.

11. The method of claim 10, comprising forming dielectric material in the gap between the first gate and the second gate.

12. The method of claim 10, wherein the first gate is formed so that the boundary between the body and the drain drift region at the top surface of the substrate is located under the first gate.

13. A method of forming a semiconductor device, comprising the steps:
providing a substrate comprising a p-type semiconductor material;
forming a drain drift region of a split-gate transistor of the semiconductor device in the substrate, the drain drift region being n-type, the drain drift region abutting a body of the split-gate transistor, the body being p-type;
forming a gate dielectric layer of the split-gate transistor over a top surface of the substrate, the gate dielectric layer being located over the boundary between the drain drift region and the body at the top surface of the substrate, the gate dielectric layer extending at least partially over the body and extending at least partially over the drain drift region;
forming a first gate of the split-gate transistor over the gate dielectric layer, the first gate extending at least partially over the body; and
forming a second gate of the split-gate transistor over the gate dielectric layer, laterally adjacent to the first gate, the second gate extending at least partially over the drain drift region, a first portion of the second gate being vertically separated from the drain drift region by a field oxide and a second portion of the second gate being vertically separated from the drain drift region by the gate dielectric layer and not the field oxide, the second gate being laterally separated from the first gate by a gap of 10 nanometers to 250 nanometers, wherein the second gate is formed so that the boundary between the body and the drain drift region at the top surface of the substrate is located under the second gate and not under the first gate.

14. A method of forming a semiconductor device, comprising the steps:
   providing a substrate comprising a p-type semiconductor material;
   forming a drain drift region of a split-gate transistor of the semiconductor device in the substrate, the drain drift region being n-type, the drain drift region abutting a body of the split-gate transistor, the body being p-type;
   forming a gate dielectric layer of the split-gate transistor over a top surface of the substrate, the gate dielectric layer being located over the boundary between the drain drift region and the body at the top surface of the substrate, the gate dielectric layer extending at least partially over the body and extending at least partially over the drain drift region;
   forming a first gate of the split-gate transistor over the gate dielectric layer, the first gate extending at least partially over the body; and
   forming a second gate of the split-gate transistor over the gate dielectric layer, laterally adjacent to the first gate, the second gate extending at least partially over the drain drift region, a first portion of the second gate being vertically separated from the drain drift region by a field oxide and a second portion of the second gate being vertically separated from the drain drift region by the gate dielectric layer and not the field oxide, the second gate being laterally separated from the first gate by a gap of 10 nanometers to 250 nanometers, wherein the first gate and the second gate are formed so that the boundary between the body and the drain drift region at the top surface of the substrate is located under the gap between the first gate and the second gate and not under the first gate.

15. The method of claim 10, wherein forming the first gate and forming the second gate comprise the steps:
   forming a layer of gate material over the gate dielectric layer;
   forming a gate mask over the layer of gate material, the gate mask comprising a first mask element which covers an area for the first gate and a second mask element which covers an area for the second gate;
   removing the layer of gate material where exposed by the gate mask to form the first gate and the second gate; and
   subsequently removing the gate mask.

16. The method of claim 10, wherein forming the first gate and forming the second gate comprise the steps:
   forming a first layer of gate material over the gate dielectric layer;
   forming a first gate mask over the first layer of gate material, the first gate mask covering an area for the first gate;
   removing the first layer of gate material where exposed by the first gate mask to form the first gate;
   subsequently removing the first gate mask;
   forming a second layer of gate material over the gate dielectric layer and over the first gate;
   forming a second gate mask over the second layer of gate material, the second gate mask covering an area for the second gate which partially overlaps the first gate;
   removing the second layer of gate material where exposed by the second gate mask to form the second gate, the second gate partially overlapping the first gate; and
   subsequently removing the second gate mask.

17. The method of claim 10, comprising forming the field oxide by a shallow trench isolation (STI) process so that an element of the field oxide is formed over a portion of the drain drift region, and so that the second gate partially overlaps the element of field oxide over the drain drift region.

18. The method of claim 10, comprising forming the field oxide as a thin field oxide, 50 nanometers to 150 nanometers thick, so that an element of the thin field oxide is formed over a portion of the drain drift region, and so that the second gate partially overlaps the element of thin field oxide over the drain drift region.

* * * * *